US012570522B2

(12) United States Patent (10) Patent No.: US 12,570,522 B2
Stahl et al. (45) Date of Patent: Mar. 10, 2026

(54) METHOD FOR PRODUCING AT LEAST ONE FIRST AND ONE SECOND MICROMIRROR DEVICE

(71) Applicant: Robert Bosch GmbH, Stuttgart (DE)

(72) Inventors: Heiko Stahl, Reutlingen (DE); Rainer Straub, Ammerbuch (DE)

(73) Assignee: ROBERT BOSCH GMBH, Stuttgart (DE)

( * ) Notice: Subject to any disclaimer, the term of this patent is extended or adjusted under 35 U.S.C. 154(b) by 251 days.

(21) Appl. No.: 17/793,606

(22) PCT Filed: Mar. 25, 2021

(86) PCT No.: PCT/EP2021/057719
§ 371 (c)(1),
(2) Date: Jul. 18, 2022

(87) PCT Pub. No.: WO2021/209238
PCT Pub. Date: Oct. 21, 2021

(65) Prior Publication Data
US 2023/0066345 A1 Mar. 2, 2023

(30) Foreign Application Priority Data

Apr. 17, 2020 (DE) ..................... 10 2020 204 910.6

(51) Int. Cl.
*B81C 1/00* (2006.01)
*B81B 7/02* (2006.01)
(52) U.S. Cl.
CPC ............ *B81C 1/00404* (2013.01); *B81B 7/02* (2013.01); *B81C 1/00619* (2013.01);
(Continued)
(58) Field of Classification Search
None
See application file for complete search history.

(56) References Cited

U.S. PATENT DOCUMENTS

2005/0136663 A1 6/2005 Terence Gan et al.
2006/0057761 A1* 3/2006 Mi ..................... G02B 26/0841
438/57
(Continued)

FOREIGN PATENT DOCUMENTS

CN 1813489 A 8/2006
CN 109160481 A 1/2019
(Continued)

OTHER PUBLICATIONS

D. Martin and S. Sullivan,, "Dicing of MEMS Devices", Handbook of Silicon Based MEMS Materials and Technology, DOI: http://dx. doi.org/10.1016/B978-0-323-29965-7.00036-1, pp. 671-677. (Year: 2015).*

(Continued)

*Primary Examiner* — Jiong-Ping Lu
(74) *Attorney, Agent, or Firm* — NORTON ROSE FULBRIGHT US LLP

(57) ABSTRACT

A method for producing a first and second micromirror device. A silicon oxide layer is applied to at least the front side of a silicon wafer. The silicon oxide layer is removed so that a first and second separation region of the silicon oxide layer are generated, which are arranged spatially separated from each other along a separation plane. A silicon layer is applied to the front side of the silicon wafer and to the silicon oxide layer. An etching mask is applied to the rear side of the silicon wafer, the etching mask having a first opening along the separation plane of the first and second separation region. The silicon layer and the silicon wafer are removed, according to the etching mask on the rear side of the silicon wafer and according to the silicon oxide layer of the first and second separation region.

17 Claims, 7 Drawing Sheets

(52) U.S. Cl.
CPC ... *B81B 2201/014* (2013.01); *B81B 2201/042*
(2013.01); *B81C 2201/014* (2013.01); *B81C*
*2201/0198* (2013.01); *B81C 2203/033*
(2013.01)

(56) References Cited

U.S. PATENT DOCUMENTS

| | | | |
|---|---|---|---|
| 2011/0136283 A1 | 6/2011 | Gritters et al. | |
| 2011/0168908 A1* | 7/2011 | Wang ................. | B81C 1/00619 |
| | | | 257/E21.295 |
| 2012/0085728 A1 | 4/2012 | Chen et al. | |
| 2013/0059428 A1* | 3/2013 | Arai ................... | B23K 26/3568 |
| | | | 257/E21.599 |
| 2014/0367805 A1* | 12/2014 | Chen ................... | B81C 1/00595 |
| | | | 438/53 |

FOREIGN PATENT DOCUMENTS

| | | | | |
|---|---|---|---|---|
| DE | 102008041178 A1 | | 2/2010 | |
| JP | 2014085409 | * | 5/2014 | .............. B81C 1/00 |
| JP | 2014085409 A | | 5/2014 | |
| WO | 2014064606 A1 | | 5/2014 | |

OTHER PUBLICATIONS

F. Laemer and A. Urban, "Challenges, developments and application of silicon deep reactive ion etching", Microelectronic Engineering, vol. 67-68, pp. 349-355. (Year: 2003).*
International Search Report for PCT/EP2021/057719, Issued Jul. 8, 2021.

* cited by examiner

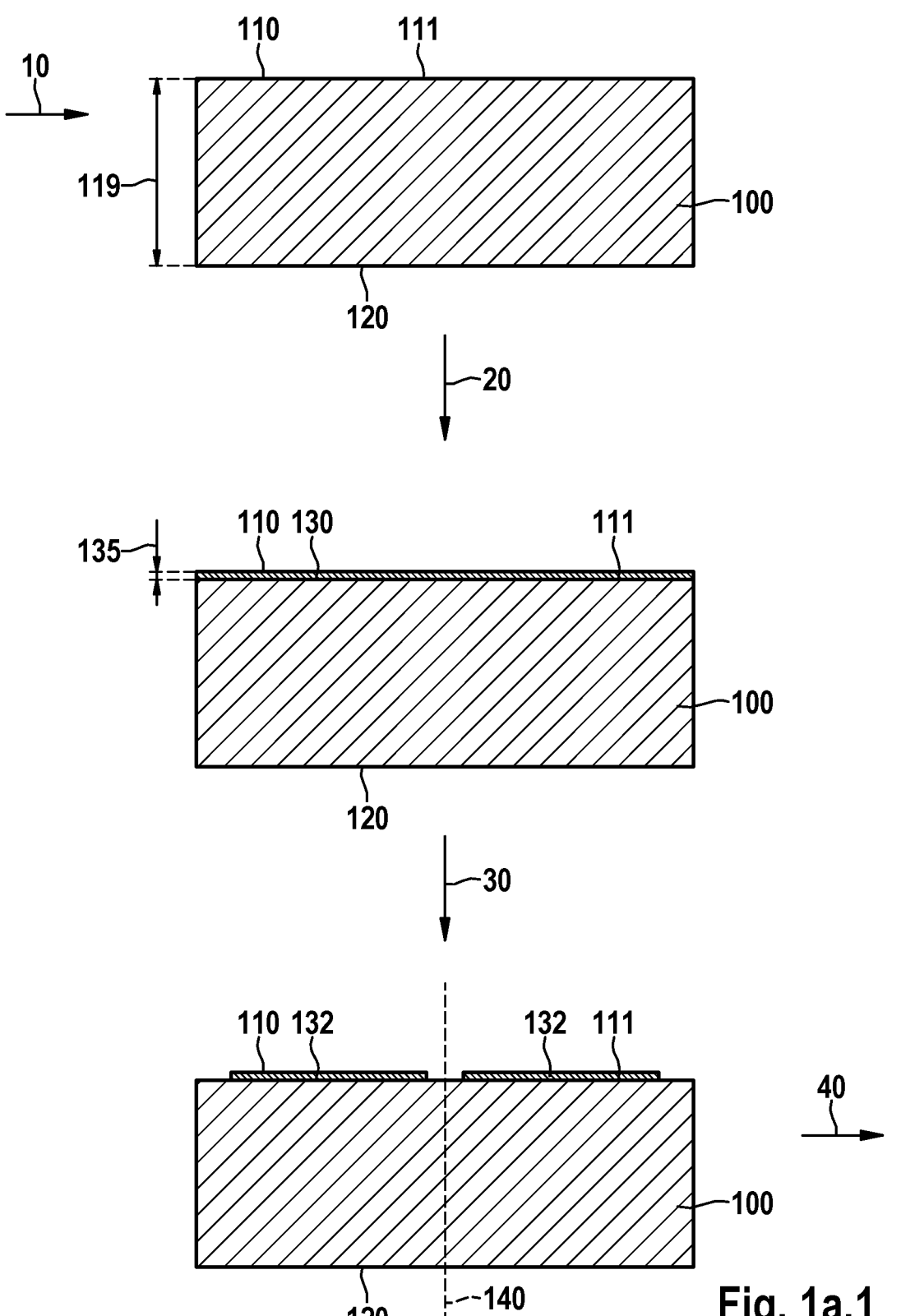
Fig. 1a.1

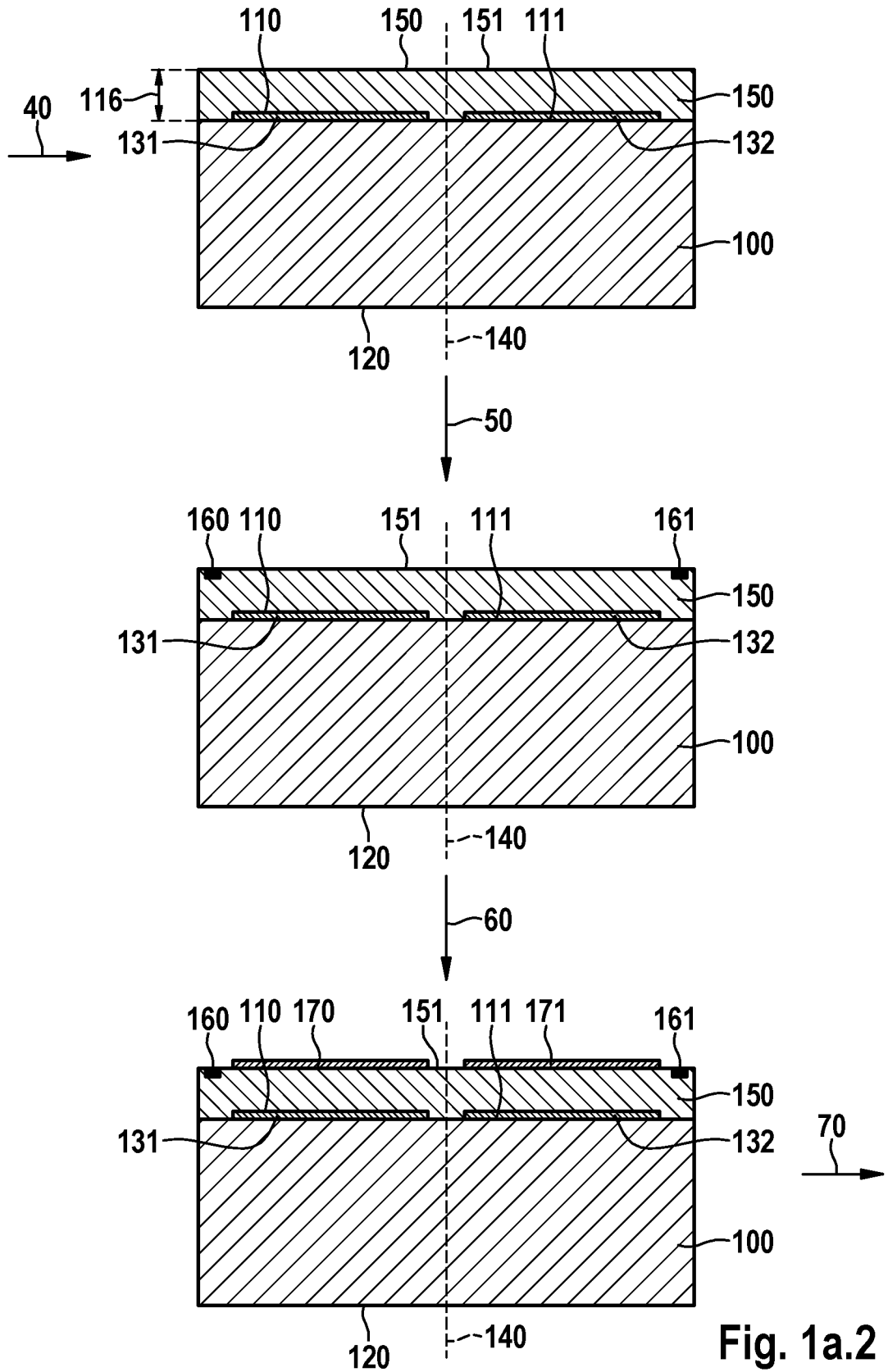
Fig. 1a.2

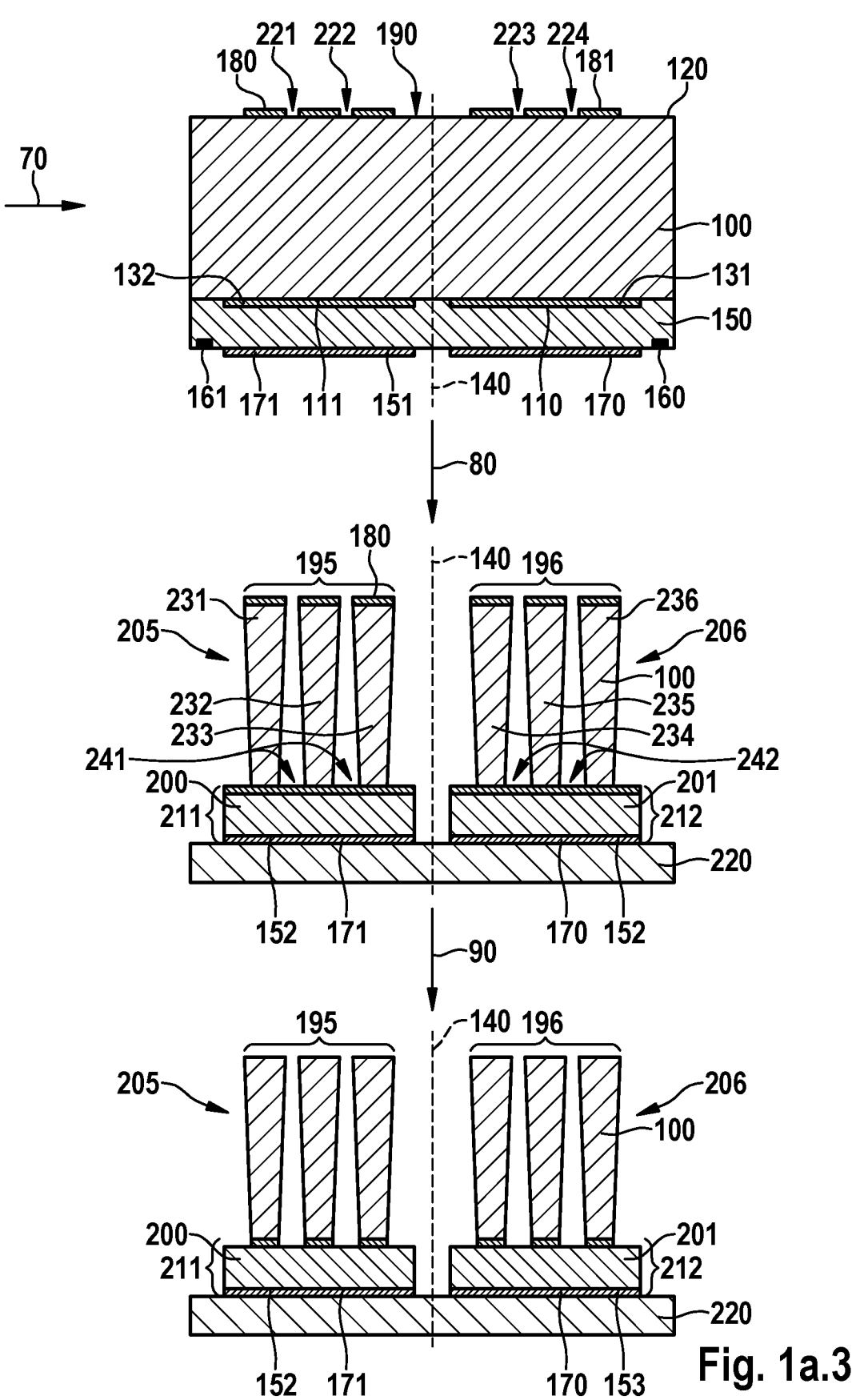
Fig. 1a.3

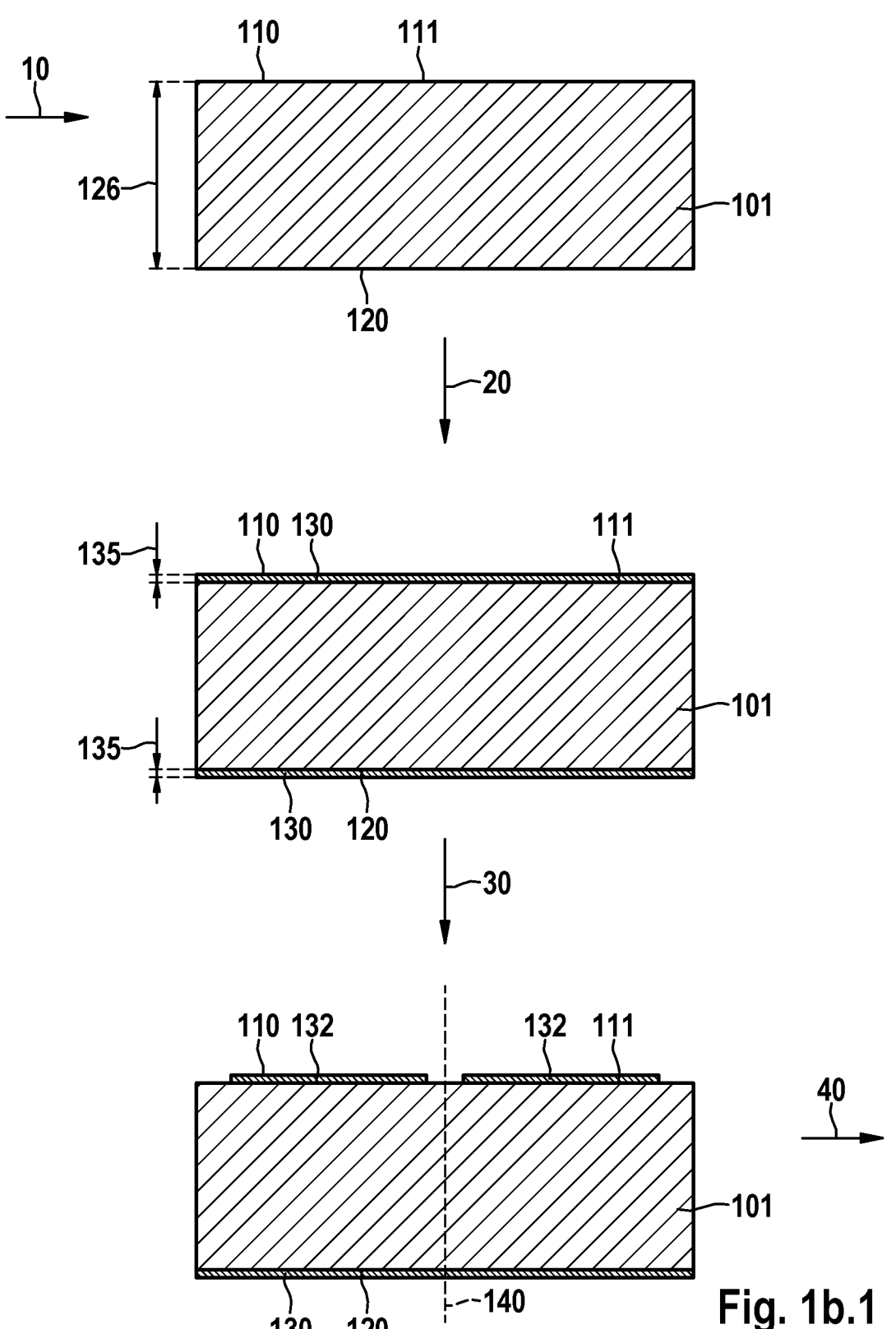
Fig. 1b.1

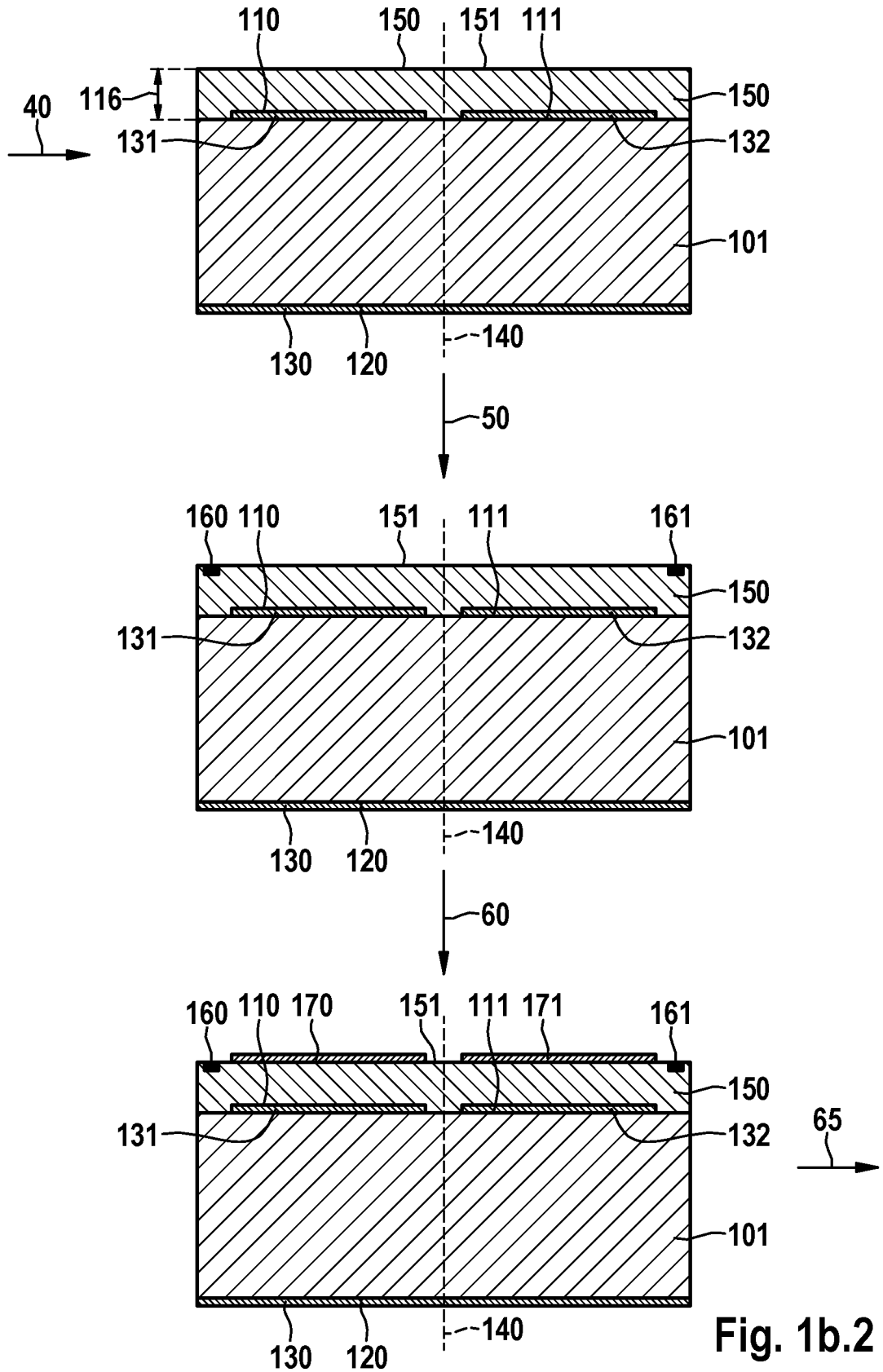
Fig. 1b.2

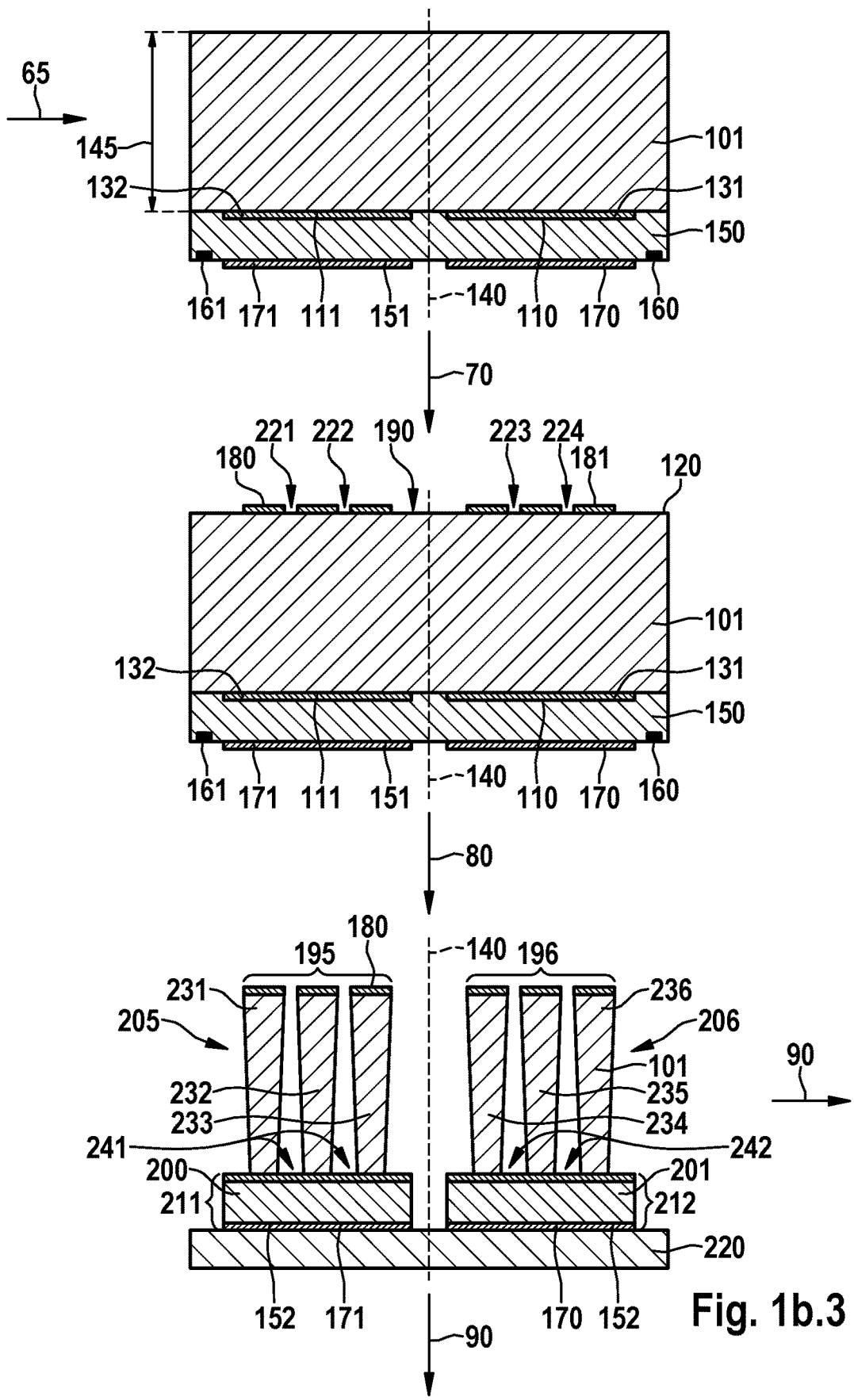
Fig. 1b.3

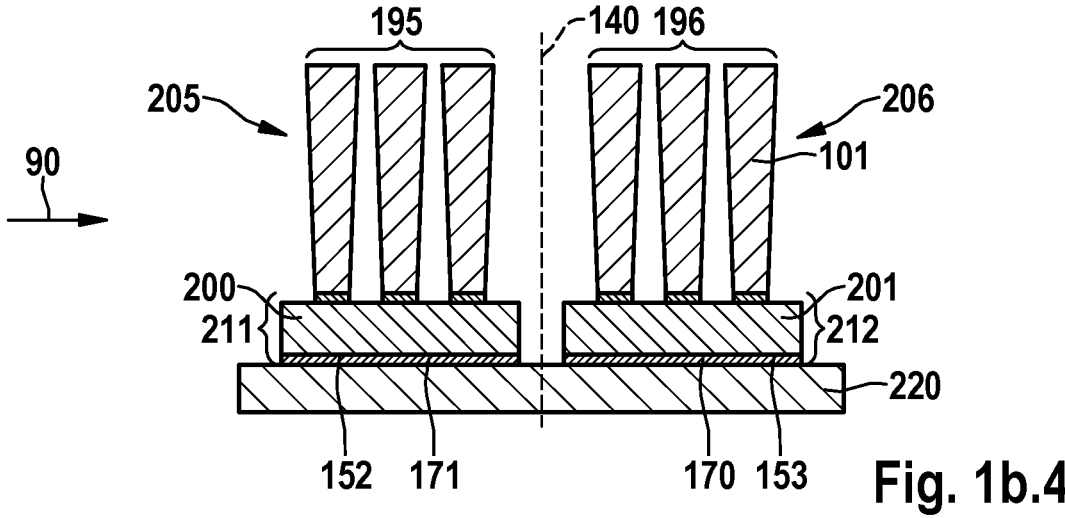
Fig. 1b.4
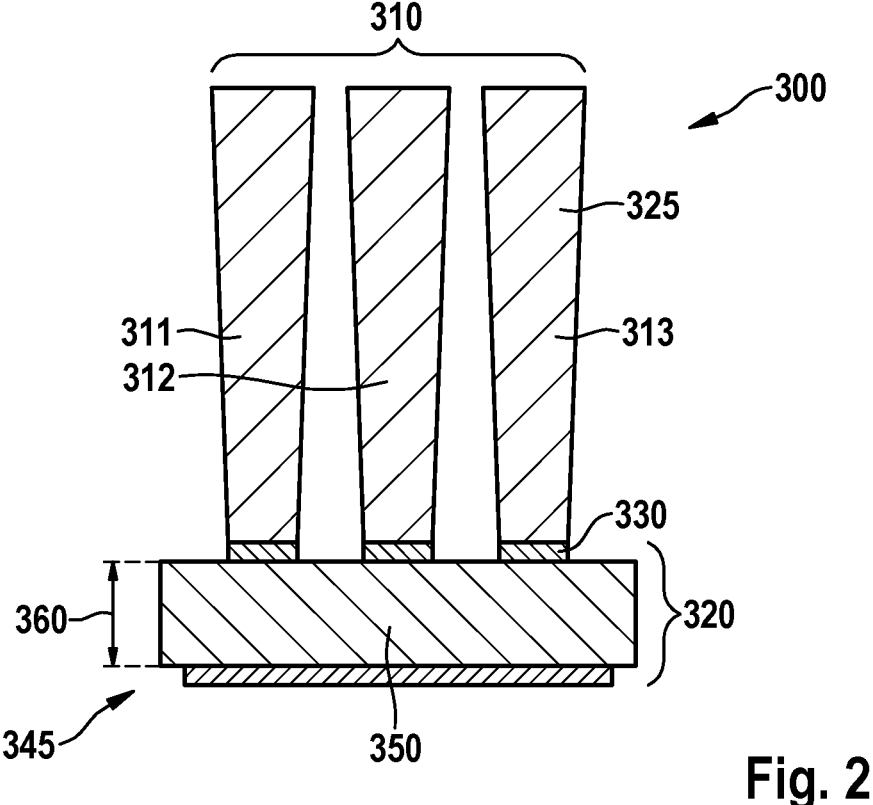
Fig. 2

METHOD FOR PRODUCING AT LEAST ONE FIRST AND ONE SECOND MICROMIRROR DEVICE

FIELD

The present invention relates to a method for producing at least one first and one second micromirror device. In addition, the present invention relates to a first and/or second micromirror device, produced by the method, and a first and/or second micromirror device, having a first and/or second mirror plate, each having a polysilicon layer.

BACKGROUND INFORMATION

A method for producing micromirrors is described in PCT Patent Application No. WO 2014/064606 A1. In this, a silicon oxide wafer is used, which, in one method step, is firstly separated along a separation plane by wet etching and, in a further, separate method step, the mirror plates of the micromirror are singulated.

An object of the present invention is to provide a simplified method for producing micromirror devices.

SUMMARY

To achieve the object, a method for producing at least one first and one second micromirror device is provided according to the present invention. In this context, a micromirror device refers in particular to a mechanical micromirror, i.e. a micromirror, which is not yet connected to the drive unit of the micromirror. In accordance with an example embodiment of the present invention, in one method step, a silicon wafer, in particular a plate-type silicon wafer, having a front side and a rear side, is provided. The front side of the silicon wafer refers in particular to the side which, in the finished micromirror device, is aligned in the direction of the surface of the micromirror device which is reflective for incident light rays. In a further method step, a silicon oxide layer is thermally applied to at least the front side of the silicon wafer, in particular with a layer thickness of the silicon oxide layer in a range of 1 μm to 3 μm. In particular, the silicon oxide layer is applied with a layer thickness of 2 μm. In a subsequent method step, the silicon oxide layer is removed, in particular up to an outer surface of the silicon wafer, in such a way that at least one first separation region and at least one second separation region of the silicon oxide layer are generated. In this case, the first and the second separation region of the silicon oxide layer are arranged spatially separated from each other along a separation plane. Accordingly, there is no longer a material coherence between the first and second separation region of the silicon oxide layer. The separation plane is, in particular, a plane which is arranged substantially perpendicularly to an outer surface of the silicon wafer. In a further method step, a silicon layer, in particular a polysilicon layer with a layer thickness in a range of 5 μm to 50 μm, is applied to the front side of the silicon wafer and to the silicon oxide layer, in particular to the first and second separation region of the silicon oxide layer. The silicon layer is therefore in direct contact with the front side of the silicon wafer, in particular with an external surface of the front side of the silicon wafer, and with the silicon oxide layer, in particular with an outer surface of the silicon oxide layer. An etching mask is furthermore applied to the rear side of the silicon wafer, the etching mask having a first opening along the separation plane of the first and second separation region of the silicon oxide layer. The etching mask is, in particular, a hard mask or a resist mask. In particular, a further silicon oxide layer is applied to the rear side of the silicon wafer as an etching mask. In a further method step, the silicon layer, in particular part of the silicon layer, and the silicon wafer, in particular part of the silicon wafer, are removed, using an etching method, according to the etching mask on the rear side of the silicon wafer and according to the silicon oxide layer of the silicon wafer, in particular of the first and second separation region of the silicon oxide layer, so that at least one first and one second micromirror device are generated. In this case, the etching mask as well as the silicon oxide layer serve as layers which stop the etching (etching stop layers). By using the prestructured silicon oxide wafer in the method described here, it is possible to execute the last-described method step, in which the micromirror devices are separated from each other, in a single method step. By removing the silicon layer, in particular the part of the silicon layer, using the etching method, at least one first separation region and one second separation region of the silicon layer are preferably generated. In this case, the first and the second separation region of the silicon layer are arranged spatially separated from each other along the separation plane, and consequently form a first mirror plate of the first micromirror device, comprising the first separation region of the silicon layer, and a second mirror plate of the second micromirror device, comprising the second separation region of the silicon layer. In a micromirror, the reflective surfaces of such mirror plates later serve to deflect incident light rays, for example for projecting an image. Such mirror plates have a reflection surface of 50 mm² to 200 mm², for example. The mirror plates have a circular, oval or rectangular form, for example. In this context, the first and the second separation region of the silicon oxide layer are preferably generated according to a desired respective size and the respective shape, in particular a circular and/or oval and/or rectangular shape, of the first mirror plate of the first micromirror device and the second mirror plate of the second micromirror device. By removing the silicon wafer, in particular the part of the silicon wafer, using the etching method, at least one first separation region and one second separation region of the silicon wafer are furthermore preferably generated. In this case, the first and the second separation region of the silicon wafer are arranged spatially separated from each other along a separation plane. Consequently, a first reinforcing structure of the first micromirror device, comprising the first separation region of the silicon wafer and the first separation region of the silicon oxide layer, and a second reinforcing structure of the second micromirror device, comprising the second separation region of the silicon wafer and the second separation region of the silicon oxide layer, are generated. Such a reinforcing structure serves to connect the mirror plate to the future drive unit of the micromirror. In this case, on the one hand, the reinforcing structure should weigh as little as possible in order to enable good mobility of the micromirror; on the other, the reinforcing structure of the mirror plate must also provide the necessary stability. In this context, the etching mask preferably furthermore has at least one second opening, in particular for separating the first reinforcing structure into a first separation region of the first reinforcing structure and a second separation region of the first reinforcing structure. Consequently, the respective reinforcing structure may be constructed as at least two reinforcing braces extending parallel to each other. A plasma etching method, in particular the DRIE etching method, is preferably used as the etching method. Alternatively, an ion beam etching method is used as the etching method. The mirror plate, as well as the reinforcing structure of a micromirror device, may therefore be generated in a single method step.

In accordance with an example embodiment of the present invention, the silicon wafer is preferably provided as a bare wafer having a thickness of substantially 300 to 400 μm at the start of the method. In this case, at the start of the method, the bare wafer already has a thickness equivalent to the target thickness of the reinforcing structure if this is to meet the conditions regarding weight and stability. Alternatively, the silicon wafer is provided as a bare wafer having a thickness of substantially 725 μm at the start of the method. In this case, in a further method step, which follows the application of the silicon layer, in particular the polysilicon layer, to the front side of the silicon wafer and to the silicon oxide layer, the rear side of the silicon wafer is preferably ground, in particular until a target thickness of the silicon wafer is achieved. The target thickness corresponds in particular to a layer thickness in a range of 300 μm to 400 μm.

The silicon oxide layer is preferably additionally thermally applied to the rear side of the silicon wafer. In this case, the silicon oxide layer may be used, for example, as an etching mask on the rear side if the silicon wafer is provided as a bare wafer having a thickness of substantially 300 μm to 400 μm at the start of the method.

In accordance with an example embodiment of the present invention, in a further method step, a first metal layer, in particular a first gold layer or a first aluminum layer, is preferably applied to the silicon layer, in particular to an outer surface of the first separation region of the silicon layer. A second metal layer, in particular a second gold layer or a second aluminum layer, is furthermore applied to the silicon layer, in particular to an outer surface of the second separation region of the silicon layer. The reflectance of the mirror plate of the respective micromirror device is therefore increased. To align the first metal layer relative to the first separation region of the silicon oxide layer and to align the second metal layer relative to the at least second separation region of the silicon oxide layer, at least two markings are preferably applied to the silicon layer. In this case, the at least two markings are etched in particular into an outer surface of the silicon layer. In order to apply the markings to the silicon layer in the correct position, in particular, an infrared measuring device is used, which enables the structure of both the first separation region and the at least second separation region of the silicon oxide layer which is buried within the layer stack to be detected. The at least two markings are then applied, in particular, to an edge region of the layer stack. The metal layers on the front side of the silicon wafer may therefore be aligned with respect to the structure of both the first separation region and the at least second separation region of the silicon oxide layer which is buried within the layer structure.

Preferably, the silicon layer, in particular an outer surface of the first separation region of the silicon layer and an outer surface of the second separation region of the silicon layer, is directly or indirectly connected to an adhesive tape, in particular a single-sided adhesive tape. The adhesive tape, which may be formed, in particular, as blue tape, serves, on the one hand, for transporting the completed first and second micromirror device to the respective drive unit of the micromirror and, on the other, for stopping the etching process in which part of the silicon layer and of the silicon wafer is removed.

In accordance with an example embodiment of the present invention, in a further method step, the etching mask is preferably removed. If the etching mask is a resist mask, the etching mask is removed using a plasma strip, for example. In the case of a hard mask as an etching mask, the etching mask may be removed using an oxide etching process. If an oxide etching process is used, the exposed parts of the silicon oxide layer on the front side of the silicon wafer are likewise etched away. The pressure exerted on the mirror plate by the reinforcing structure may therefore be reduced.

The silicon layer is preferably applied to the front side of the silicon wafer and to the silicon oxide layer, in particular to the first and second separation region of the silicon oxide layer, in the form of a silicon deposit, in particular polysilicon deposit, and a subsequent polishing step.

A further subject matter of the present invention is a first and/or second micromirror device, produced by the above-described method.

A further subject matter of the present invention is a first and/or second micromirror device, in particular produced using the above-described method, having a first and/or second mirror plate, each having a polysilicon layer. If the silicon wafer is a bare wafer, a polysilicon layer may be applied to the outer surface of the silicon wafer. Such a polysilicon layer can be easily applied to any desired surfaces of the silicon wafer. The polysilicon layer preferably has a layer thickness in a range of 5 μm to 50 μm. The polysilicon layer furthermore preferably has a layer thickness of substantially 20 μm.

BRIEF DESCRIPTION OF THE DRAWINGS

FIGS. 1A.1-1A.3 schematically show the method steps of a first specific embodiment of a method for producing at least one first and one second micromirror device, according to the present invention.

FIGS. 1B.1-1B.4 schematically show the method steps of a second specific embodiment of a method for producing at least one first and one second micromirror device, according to the present invention.

FIG. 2 shows a first micromirror device having a first and/or second mirror plate, each having a polysilicon layer, according to the present invention.

DETAILED DESCRIPTION OF EXAMPLE EMBODIMENTS

FIGS. 1A.1-1A.3 schematically show the method steps of a first specific embodiment of a method for producing at least one first and one second micromirror device. In this case, in a first method step 10, a silicon wafer 100, in particular a plate-type silicon wafer 100, having a front side 110 and a rear side 120, is provided. In a subsequent method step 20, a silicon oxide layer 130 is applied to the front side 110 of the silicon wafer 100, in particular with a layer thickness 135 of the silicon oxide layer 130 of substantially 2 μm. In a subsequent method step 30, the silicon oxide layer 130 is removed, in particular up to an outer surface 111 of the silicon wafer 100, in such a way that a first separation region 131 and a second separation region 132 of the silicon oxide layer 130 are generated. In this case, the first 131 and the second separation region 132 of the silicon oxide layer 130 are arranged spatially separated from each other along a separation plane 140. In a subsequent method step 40, a silicon layer 150, in particular having a layer thickness 116 of substantially 20 μm, is applied to the front side 110 of the silicon wafer 100 and to the first 131 and second separation region 132 of the silicon oxide layer 130. In this case, the silicon layer 150 is a polysilicon layer. In a subsequent method step 70, an etching mask 180 is applied to the rear side 120 of the silicon wafer 100. In this case, the etching mask 180 has a first opening 190 along the separation plane 140. In this case, the etching mask 180 is a hard mask, which is formed from a further silicon oxide layer 181 and is applied to the rear side 120 of the silicon wafer. In a subsequent method step 80, the silicon layer 150, in particular part of the silicon layer 150, and the silicon wafer 100, in particular part of the silicon wafer 100, are removed, using an etching method, according to the etching mask 180 on the rear side 120 of the silicon wafer 100 and according to the first 131 and second separation region 132 of the silicon oxide layer 130, so that at least one first 205 and one second micromirror device 206 are generated. In this case, the first 131 and second separation region 132 of the silicon oxide layer 130 are formed as etching stop layers.

In the illustrated exemplary embodiment, by removing the silicon layer 150 using the etching method in method step 80, at least one first separation region 200 and one second separation region 201 of the silicon layer 150 are generated. The first 200 and the second separation region 201 of the silicon layer 150 are likewise arranged spatially separated from each other along the separation plane 140. A first mirror plate 211 of the first micromirror device 205, comprising the first separation region 200 of the silicon layer 150, and a second mirror plate 212 of the second micromirror device 206, comprising the second separation region 201 of the silicon layer 150, are therefore generated.

In the illustrated exemplary embodiment, by removing the silicon wafer 100 using the etching method in method step 80, a first separation region and a second separation region of the silicon wafer 100 are furthermore generated. In this case, the first and the second separation region of the silicon wafer 100 are arranged spatially separated from each other along a separation plane 140. A first reinforcing structure 195 of the first micromirror device 205, comprising the first separation region of the silicon wafer 100 and the first separation region 131 of the silicon oxide layer 130, and a second reinforcing structure 196 of the second micromirror device 206, comprising the second separation region of the silicon wafer 100 and the second separation region 132 of the silicon oxide layer 130, are therefore generated.

In the illustrated exemplary embodiment, the etching mask 180 furthermore has a second 221, third 222, fourth 223 and fifth opening 224. These openings are designed to divide the first 195 and second reinforcing structure 196 into further separation regions, which, in this embodiment, are formed as first 231, second 232, third 233, fourth 234, fifth 235 and sixth 236 reinforcing braces.

In the illustrated, first specific embodiment of the method, in method step 80, a plasma etching method, in particular the DRIE etching method, is used as the etching method.

In the illustrated, first specific embodiment of the method, in method step 10, the silicon wafer 100 having a thickness 119 of substantially 300 to 400 µm is provided.

In a further method step 60, in this first specific embodiment of the method, a first metal layer 170 is applied to an outer surface 151 of the silicon layer 150. In this case, the first metal layer is formed as a gold layer and this gold layer is applied to a region of the silicon layer 150 which later corresponds to the first separation region 200 of the silicon layer 150. A second metal layer 171 is furthermore applied to an outer surface 151 of the silicon layer 150. In this case, the second metal layer 171 is also formed as a gold layer and this gold layer is here applied to a region of the silicon layer 150 which later corresponds to the second separation region 201 of the silicon layer 150. In a method step 50, following the method step 40, two markings 160 and 161 are furthermore applied to the silicon layer 150. In this case, the two markings 160 and 161 are etched into an outer surface 151 of the silicon layer 150. These markings 160 and 161 serve for aligning the first metal layer 170 relative to the first separation region 131 of the silicon oxide layer 130 and for aligning the second metal layer 171 relative to the at least second separation region 132 of the silicon oxide layer. In order to apply the markings 160 and 161 to the silicon layer 150 in the correct position, an infrared measuring device (not illustrated here) is used for this purpose, which enables the first separation region 131 and second separation region 132 of the silicon oxide layer 130, which are buried within the layer stack, comprising the silicon wafer 100 and the silicon layer, to be detected. The at two markings 131 and 132 are then applied in particular to an edge region of the layer stack.

An outer surface 152 of the first separation region 200 of the silicon layer 150 and an outer surface 153 of the second separation region 201 of the silicon layer are furthermore connected indirectly to an adhesive tape 220. In the illustrated case, the first 170 and second metal layer 171 are integrally bonded directly to the adhesive tape 220. In the illustrated exemplary embodiment, the adhesive tape 220 serves, on the one hand, as an etching stop layer during the etching process in method step 80. On the other, the adhesive tape 220, which is formed in particular as a single-sided adhesive tape, serves for transporting the completed first and second micromirror devices to the respective drive unit, in particular piezoelectric drive unit, of the micromirror, which drive unit is not illustrated here.

In a further method step 90, the etching mask 180, which is formed as a hard mask in this case, is removed using an oxide etching process. In this case, the exposed regions 241 of the first separation region 131 of the silicon oxide layer 130 and the exposed regions 242 of the second separation region 132 of the silicon oxide layer 130 are likewise etched away.

FIGS. 1B.1-1B.4 schematically show the method steps of a second specific embodiment of a method for producing at least one first and one second micromirror device. In this case, in contrast to the first specific embodiment, a silicon wafer 101 having a thickness 126 of substantially 725 µm is provided in method step 11. Moreover, in the subsequent method step 20, a silicon oxide layer 130 is applied not only to the front side 110 of the silicon wafer 101, but additionally also to the rear side 120 of the silicon wafer 101. In contrast to the first specific embodiment of the method, in a method step 65, which follows the method step 60, the rear side 120 of the silicon wafer 101 is furthermore ground until a target thickness 145 of the silicon wafer 101 is achieved. In this case, the target thickness 145 corresponds to a thickness of the silicon wafer 101 of substantially 300 µm to 400 µm.

FIG. 2 shows a first micromirror device 300, which is produced in particular using one of the methods described in FIGS. 1A.1-1A.3 or FIGS. 1B.1-1B.4. In this case, the micromirror device 300 has a reinforcing structure 310, which is divided here into a first 311, second 312 and third reinforcing brace 313. Each reinforcing brace 311, 312 and 313 comprises part of a first separation region 325 of a silicon wafer and part of a first separation region 330 of a silicon oxide layer. The reinforcing braces 311, 312 and 313 may likewise be connected to each other via transverse braces (not illustrated here). The first micromirror device 300 furthermore has a first mirror plate 320. In this case, this mirror plate 320 comprises a first separation region 345 of a silicon layer 350. In this case, the silicon layer 350 is formed as a polysilicon layer. In the illustrated case, the polysilicon layer has a layer thickness 360 of substantially 20 μm.

What is claimed is:

1. A method for producing at least one first and one second micromirror device, the method comprising the following method steps:

providing a silicon wafer, the silicon wafer being a plate-type silicon wafer having a front side and a rear side;

applying a silicon oxide layer to at least the front side of the silicon wafer with a layer thickness of the silicon oxide layer in a range of 1 μm to 3 μm;

removing the silicon oxide layer up to an outer surface of the silicon wafer, in such a way that at least one first separation region and at least one second separation region of the silicon oxide layer are generated, the first and the second separation region of the silicon oxide layer being arranged spatially separated from each other along a separation plane;

applying a silicon layer with a layer thickness in a range of 5 μm to 50 μm, to the front side of the silicon wafer and to the first and second separation region of the silicon oxide layer;

applying an etching mask to the rear side of the silicon wafer, the etching mask having a first opening along the separation plane of the first and second separation region of the silicon oxide layer; and removing the silicon layer and the silicon wafer, using an etching method, according to the etching mask on the rear side of the silicon wafer and according to the first and second separation region of the silicon oxide layer, so that at least one first and one second micromirror device are generated, wherein the etching mask further comprises at least one additional opening for separating a reinforcing structure of the first micromirror device into a first and second separation region of the reinforcing structure, and wherein the reinforcing structure comprises at least two reinforcing braces extending parallel to each other.

2. The method as recited in claim 1, wherein, by removing the silicon layer using the etching method, the first separation region and second separation region of the silicon layer are generated, the first and the second separation region of the silicon layer being arranged spatially separated from each other along the separation plane, thereby generating a first mirror plate of the first micromirror device, including the first separation region of the silicon layer, and a second mirror plate of the second micromirror device, including the second separation region of the silicon layer.

3. The method as recited in claim 2, wherein, by removing the silicon wafer using the etching method, at least one first separation region and one second separation region of the silicon wafer are generated, the first and the second separation region of the silicon being arranged spatially separated from each other along the separation plane, thereby generating a first reinforcing structure of the first micromirror device, including the first separation region of the silicon wafer and the first separation region of the silicon oxide layer, and a second reinforcing structure of the second micromirror device, including the second separation region of the silicon wafer and the second separation region of the silicon oxide layer.

4. The method as recited in claim 3, wherein the etching mask has at least one second opening for separating the first reinforcing structure into a first separation region, in a first reinforcing brace of the first reinforcing structure, and a second separation region in a second reinforcing brace of the first reinforcing structure.

5. The method as recited in claim 1, wherein the etching method is a plasma etching method.

6. The method as recited in claim 5, wherein the plasma etching method is a DRIE etching method.

7. The method as recited in claim 1, wherein the silicon wafer has a thickness of 300 to 400 μm.

8. The method as recited in claim 1, wherein the silicon wafer has a thickness of 725 μm.

9. The method as recited in claim 8, wherein, following the application of the silicon layer to the front side of the silicon wafer and to the silicon oxide layer, the rear side of the silicon wafer is ground until a target thickness of the silicon wafer is achieved.

10. The method as recited in claim 9, wherein the silicon layer is a polysilicon layer.

11. The method as recited in claim 1, wherein the silicon oxide layer is applied to the rear side of the silicon wafer.

12. The method as recited in claim 1, further comprising:

applying a first metal layer to an outer surface of the first separation region of the silicon layer, and a second metal layer an outer surface of the second separation region of the silicon layer.

13. The method as recited in claim 12, wherein the first metal layer is a first gold layer or a first aluminum layer, and the second metal layer is a second gold layer or second aluminum layer.

14. The method as recited in claim 12, wherein to align the first metal layer relative to the first separation region of the silicon oxide layer and to align the second metal layer relative to the at least second separation region of the silicon oxide layer, at least two markings are applied to the silicon layer.

15. The method as recited in claim 1, wherein an outer surface of the first separation region of the silicon layer and an outer surface of the second separation region of the silicon layer are connected directly or indirectly to an adhesive tape.

16. The method as recited in claim 1, wherein, in a further method step, the etching mask is removed.

17. The method as recited in claim 1, wherein the silicon layer is applied to the front side of the silicon wafer and to the first and second separation region of the silicon oxide layer, in the form of a polysilicon deposit, and further the method further comprises polishing the deposited polysilicon.

* * * * *